(12) United States Patent
Yu

(10) Patent No.: US 6,288,884 B1
(45) Date of Patent: Sep. 11, 2001

(54) MOS BUFFER IMMUN TO ESD DAMAGE

(75) Inventor: Ta-Lee Yu, Hsinchu Hsien (TW)

(73) Assignee: :Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/328,161

(22) Filed: Jun. 8, 1999

(30) Foreign Application Priority Data

Nov. 16, 1998 (TW) .................................. 87118956

(51) Int. Cl.$^7$ ...................................... H02H 3/22
(52) U.S. Cl. .................... 361/111; 361/56; 361/91.1; 361/119
(58) Field of Search ................ 361/111, 56, 58, 361/91.1, 117, 11.9; 257/355, 360, 173

(56) References Cited

U.S. PATENT DOCUMENTS

| | | | |
|---|---|---|---|
| 5,623,156 | * | 4/1997 | Watt ..................................... 257/355 |
| 5,751,042 | * | 5/1998 | Yu ........................................ 257/360 |
| 5,895,940 | * | 4/1999 | Kim ..................................... 257/173 |

* cited by examiner

Primary Examiner—Stephen W. Jackson
Assistant Examiner—Sharon Polk
(74) Attorney, Agent, or Firm—Ladas & Parry

(57) ABSTRACT

A buffer is integrated with an ESD protection circuit onto a semiconductor substrate. The ESD protection circuit is triggered by means of a MOS-like device having a first spreading resistance during an ESD event. The buffer includes a plurality of finger-type devices connected in parallel, where each finger-type device is provided with a second spreading resistance less than the first spreading resistance.

4 Claims, 4 Drawing Sheets

MOS BUFFER IMMUN TO ESD DAMAGE

BACKGROUND OF THE INVENTION

1. Field of the Invention

The present invention generally relates to semiconductor integrated circuitry. More particularly, the present invention relates to a MOS buffer to ensure the triggering of an ESD protection circuit prior to the buffer during an ESD event.

2. Description of the Related Art

In sub-micron CMOS integrated circuits (ICs), electrostatic discharge, ESD hereinafter, is a reliability concern. For example, U.S. Pat. No. 5,465,189 discloses a low voltage triggering semiconductor controlled rectifier, LVTSCR hereinafter, to protect the integrated circuit from ESD damage. The equivalent circuit diagram of the conventional LVTSCR is schematically illustrated in FIG. 1.

As shown in FIG. 1, an IC core circuit 1 is coupled to a bonding pad 2 through an output buffer 10. An LVTSCR 11 is provided on the path between the pad 2 and the output buffer 10. The LVTSCR 11 can be triggered to conduct an ESD discharge current at a low voltage of about 10~15 Volts so as to bypass the ESD stress occurring to the pad 2. Accordingly, the output buffer 10 or even the core circuit 1 can be protected against ESD damage. Typically, the output buffer 10 includes a PMOS transistor 12 and an NMOS transistor 13 connected in series between VDD and VSS power rails. Referring to FIG. 2, the LVTSCR 11 fabricated onto a P-type semiconductor substrate 20 is illustrated in a cross-sectional view.

In FIG. 2, an N-well 21 is formed on the semiconductor substrate 20 in which a P-type doped region 22 is provided. An N-type doped region 23 is formed in the P-type substrate 20. Further, another N-type doped region 24 with one portion formed in the P-type substrate 20 and another portion formed in the N-well 21 is provided between the P-type doped region 22 and the N-type doped region 23. An N-type contact region 25 and a P-type contact region 26 are formed in the N-well 21 and the P-type semiconductor substrate 20 as ohmic contacts thereof, respectively. A gate structure, including a dielectric layer 27 and an electrode layer 28 from bottom to top, is provided to overlie a portion of P-type semiconductor substrate 20 between the N-type doped regions 23 and 24.

As shown in FIG. 2, the P-type doped region 22, N-well 21, and P-type semiconductor substrate 20 constitute, respectively, the emitter, base, and collector of a PNP bipolar junction transistor 14. Alternatively, the N-well 21, P-type semiconductor substrate 20, and N-type doped region 23 constitute, respectively, the collector, base, and emitter of an NPN bipolar junction transistor 15. The PNP transistor 14 and NPN transistor 15 connected in such a manner are termed a lateral semiconductor controlled rectifier. The N-type doped regions 23–24 and gate structure 27–28 constitute a MOS-like device 18. However, resistors 16 and 17 indicate the spreading resistances R of the N-well 21 and the spreading resistance R2 of the P-type semiconductor substrate 20, respectively.

Referring further to FIG. 2, the N-type contact region 25 and the P-type doped region 22 are connected to the pad 2, where the N-type doped region 23, P-type contact region 26, and electrode layer 28 are all connected to the VSS power rail. During an ESD event, the MOS-like device 18 enters avalanche breakdown to trigger the lateral semiconductor controlled rectifier for conducting a discharge current and thus bypasses the ESD stress occurring to the pad 2. Thus, the core circuit 1 can be protected from ESD damage. Accordingly, the LVTSCR 11 has a trigger voltage as low as the breakdown voltage of the MOS-like device 18.

To ensure that the PMOS transistor 12 and NMOS transistor 13 are immune to ESD damage, the MOS-like device 18 is typically provided with a gate length greater than that of the PMOS transistor 12 or NMOS transistor 13. However, the larger layout area thus required is unfavorable given the trend of high integration. Moreover, another conventional buffer formed by connecting resistors 31 or 32 between the pad 2 and respective drain of the PMOS transistor 12 and the NMOS transistor 13, is proposed to increase the effective resistance along the path from the pad 2 to the VDD rail, or from pad 2 to the VSS rail. Although effectively impeding ESD stress from being bypassed through the PMOS transistor 12 or NMOS transistor 13, the resistors 31 and 32 may diminish the performance of the output buffer during circuit operation.

SUMMARY OF THE INVENTION

Therefore, it is an object of the present invention to provide a MOS buffer which ensures a semiconductor controlled rectifier is triggered during an ESD event to bypass the ESD stress occurring to an IC pad before the MOS buffer.

To achieve the above-identified object, the present invention provides a buffer integrated with an ESD protection circuit onto a semiconductor substrate. The ESD protection circuit is triggered by means of a MOS-like device having a first spreading resistance during an ESD event. The buffer comprises a plurality of finger-type devices connected in parallel, where each finger-type device is provided with a second spreading resistance less than the first spreading resistance.

Therefore, the buffer of the present invention is provided with at least one MOS transistor configured with multifinger layout to form a plurality of finger-type devices connected in parallel. Each finger-type devices provides a bipolar junction transistor with the second spreading resistance less than that of the bipolar junction transistor provided by the MOS-like device in the ESD protection circuit so as to impede the conduction of the MOS transistor in the buffer during an ESD event. Moreover, even though the MOS transistor of the buffer and the MOS-like device of the ESD protection circuit may simultaneously enter breakdown, the bipolar junction transistors are parasitic onto the finger-type devices, and thus cause the base resistances to increase the holding current when entering snapback and uniformly bypass the ESD discharge current. In addition, the spacing between the contact and gate can be further decreased to reduce the required layout area.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Several embodiments will be described in the following. Although exemplified in view of the NMOS transistor 13 of the conventional buffer 10, these embodiments are also suited to the application of the PMOS transistor 12.

First Embodiment

Figure 1:
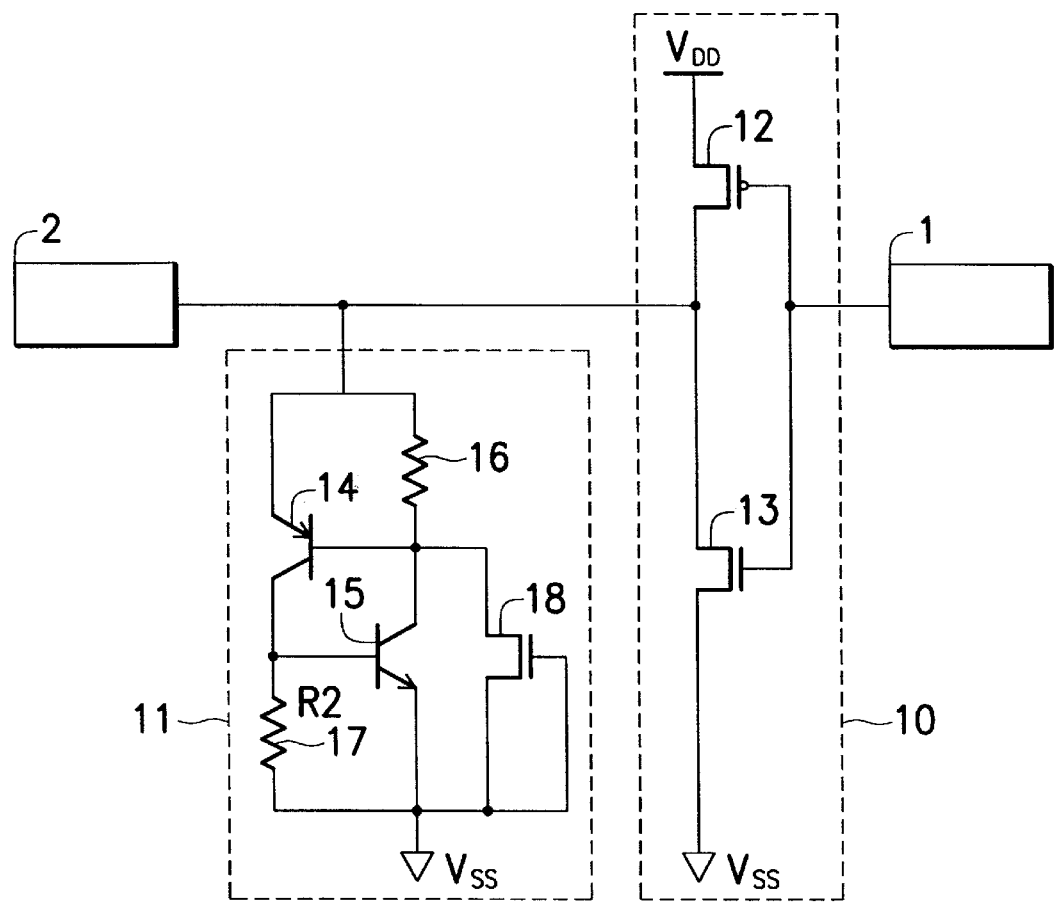
FIG. 1 is an equivalent circuit diagram illustrating a conventional output buffer and an LVTSCR.
Figure 2:
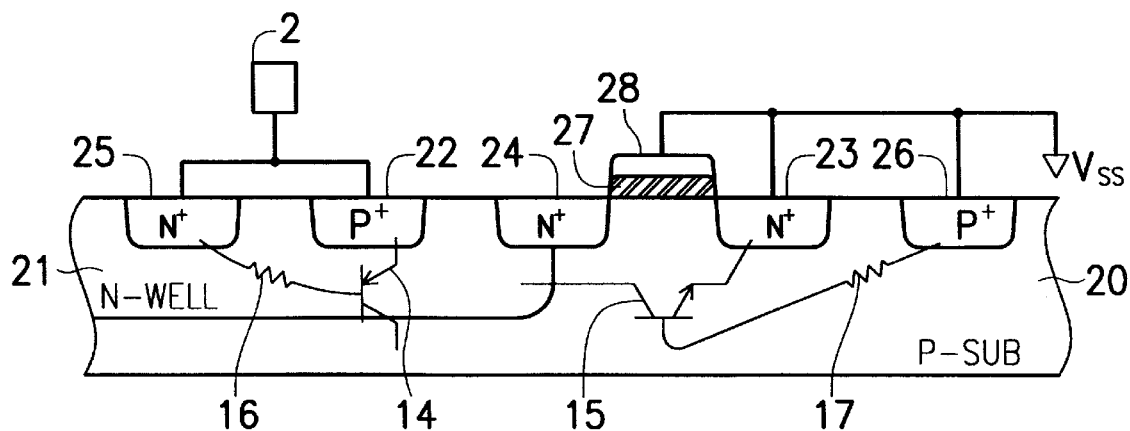
FIG. 2 depicts the LVTSCR of FIG. 1 fabricated onto a semiconductor substrate in a cross-sectional view.
Figure 3:
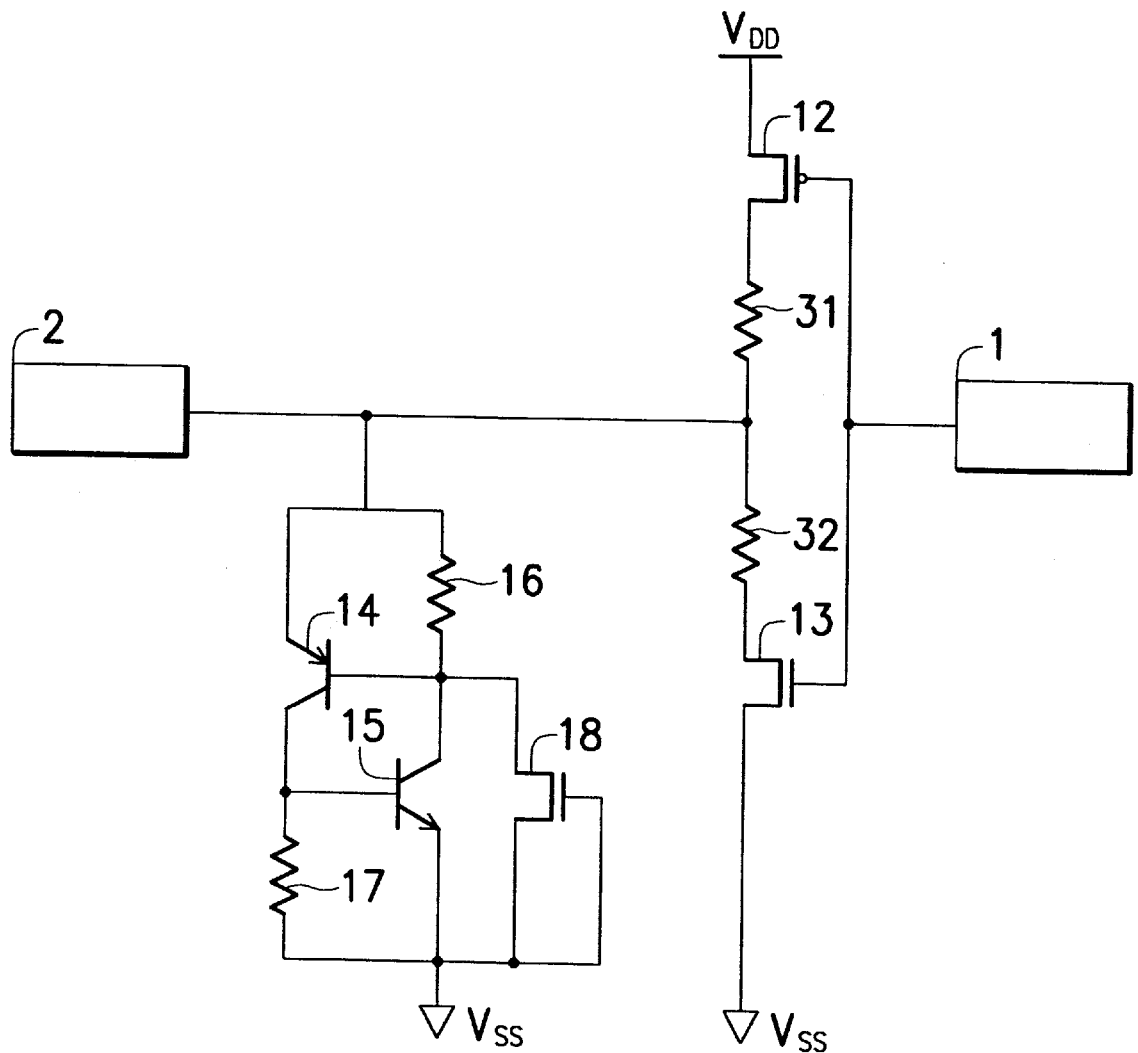
FIG. 3 is an equivalent circuit diagram illustrating another conventional output buffer and an LVTSCR.
Figure 4:
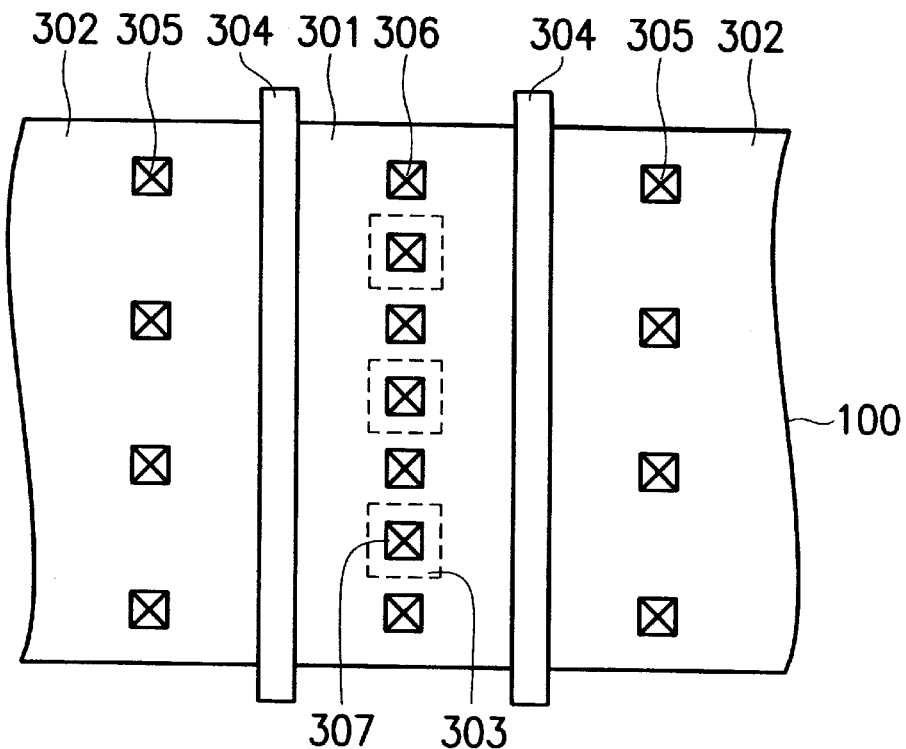
FIG. 4 depicts a layout diagram of an NMOS transistor of a buffer in accordance with a first preferred embodiment of the present invention from a top view.
Figure 5:
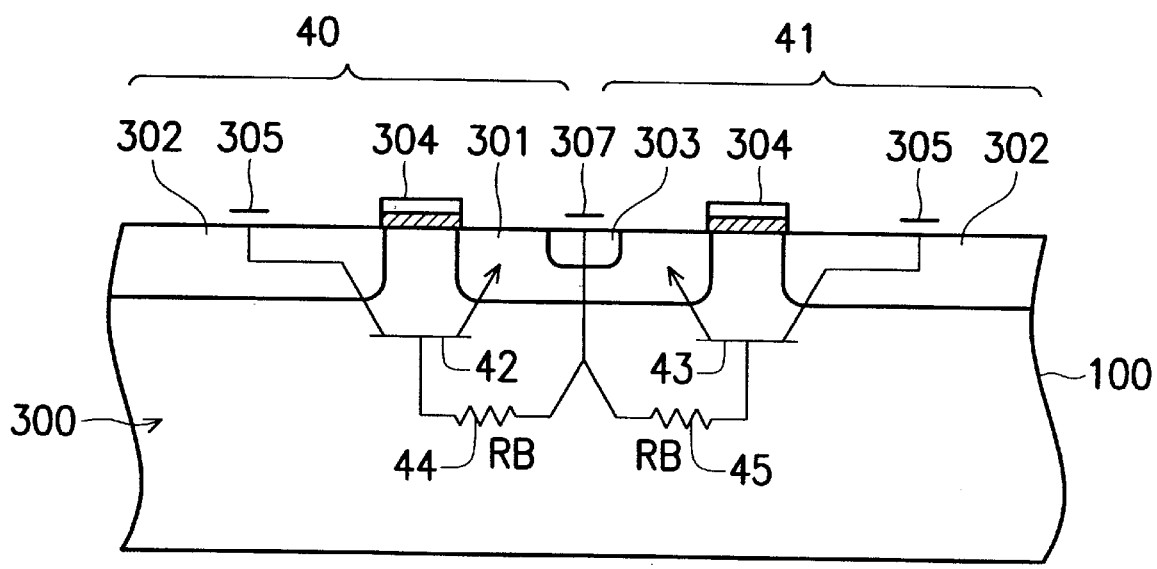
FIG. 5 depicts a cross-sectional view of FIG. 4.

Referring to FIGS. 4 and 5, the layout diagrams of an NMOS transistor of a buffer 100 in accordance with a first preferred embodiment of the present invention are schematically depicted a top view and a cross-sectional view, respectively. The NMOS transistor 13 as shown in FIG. 1 is fabricated onto a P-type semiconductor substrate or a P-well region, which is labeled as a P-type semiconductor layer 300 in the drawings.

According to the present invention, N-type source regions 301 and drain regions 302 are spaced apart and alternately formed in the P-type semiconductor layer 300. In FIGS. 4 and 5, only two N-type drain regions 302 and only one source region 301 therebetween are exemplified, but this is not intended to limit the scope of the invention to that amount.

A plurality of gate structures 304, each including a dielectric layer and an electrode layer from bottom to top, are formed to overlie a portion of the P-type semiconductor layer 300 between the adjacent N-type source region 301 and drain regions 302 to constitute finger-type devices 40 and 41. Furthermore, N-type drain region 302, P-type semiconductor layer 300, and N-type source region 301 constitutes the collector, base, and emitter, respectively, of a parasitic bipolar junction transistor. As shown in FIG. 5, the parasitic bipolar junction transistors 42 and 43 are associated with the finger-type devices 40 and 41, respectively. Reference numerals 305 and 306 designate drain contacts and source contacts, respectively.

In addition, a plurality of p-type doped regions 303 are formed in the N-type source regions 301, where reference numeral 307 designates the contact thereof. Note that the P-type doped regions 303 are bounded by the source region 301. In this embodiment, the P-type doped regions 303 are aligned along the central line of the source regions 301 which extends between the gate structures 304. Preferably, the P-type doped regions 303 and the source contacts 306 are alternately arranged along the central line. Therefore, the parasitic NPN bipolar junction transistors 42 and 43 are provided with base resistors 44 and 45 having substantially the same base resistance RB. According to the present invention, the base resistance RB of the base resistors 44–45 is less than the resistance R2 of the base resistor 17 of the NPN transistor 15 associated with the MOS-like device 18 as shown in FIG. 1.

Referring to FIGS. 1 and 5, the multi-finger layer is utilized to implement the NMOS transistor 13 in the conventional buffer 10. During an ESD event, the triggering of the MOS-like device 18 is easier than that of the NMOS transistor 13 because RB<R2. Moreover, even though the NMOS transistor 13 and the MOS-like device 18 may be simultaneously turned on during the ESD event, the bipolar junction transistors 42 and 43 provide substantially the same base resistances to increase the holding current when entering snapback, and thus bypass the ESD discharge current uniformly. In addition, the spacing between the contact and gate can be further decreased to reduce the required layout area.

Second Embodiment

Figure 6:
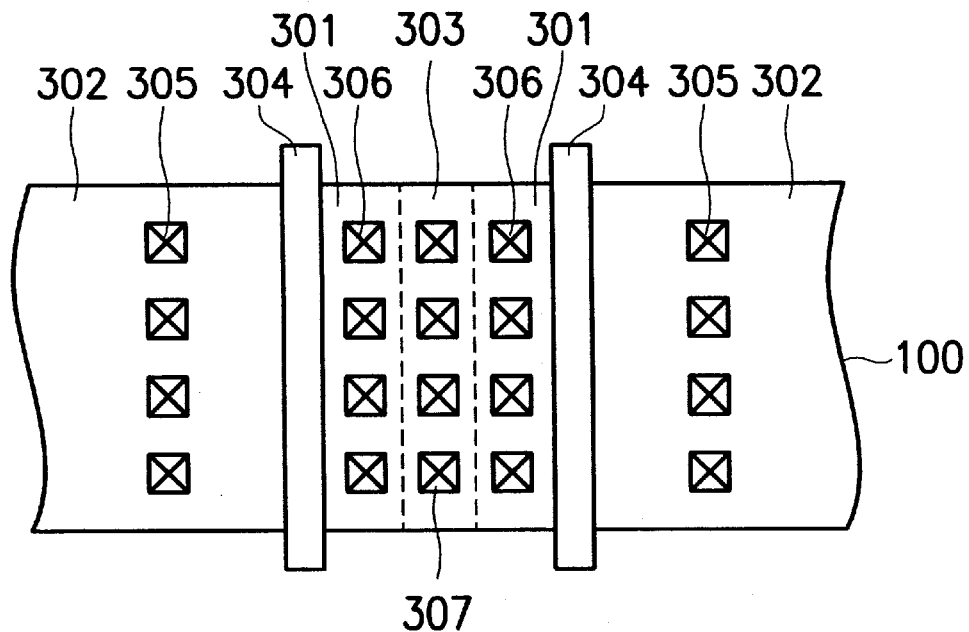
FIG. 6 depicts a layout diagram of an NMOS transistor of a buffer in accordance with a second preferred embodiment of the present invention from a top view.

Referring to FIG. 6, a layout diagram of an NMOS transistor of a buffer 100 in accordance with a second preferred embodiment of the present invention is schematically illustrated from a top view. In this case, the NMOS transistor has only one P-type doped region 303 formed along the central line in the source region 301. The P-type doped region 303 is bounded by the source region 301 and shaped into a rectangle where reference numerals 307 designate the contacts thereof. The P-type doped region contacts 307 and the source contacts 306 formed on either side of the doped region 303 are configured in an array, as shown in FIG. 6.

Referring to FIGS. 1 and 5, the base resistance RB of the base resistor 44 or 45 is less than the resistance R2 of the base resistor 17 of the NPN transistor 15 associated with the MOS-like device 18.

Referring to FIGS. 1 and 5, the multi-finger layer is utilized to implement the NMOS transistor 13 in the conventional buffer 10. During an ESD event, the triggering of the MOS-like device 18 is easier than that of the NMOS transistor 13 because RB<R2. Moreover, even though the NMOS transistor 13 and the MOS-like device 18 may be simultaneously turned on during the ESD event, the bipolar junction transistors 42 and 43 provide substantially the same base resistances to increase the holding current when entering snapback, and thus bypass the ESD discharge current uniformly. In addition, the spacing between the contact and gate can be further decreased to reduce the required layout area.

Third Embodiment

Figure 7:
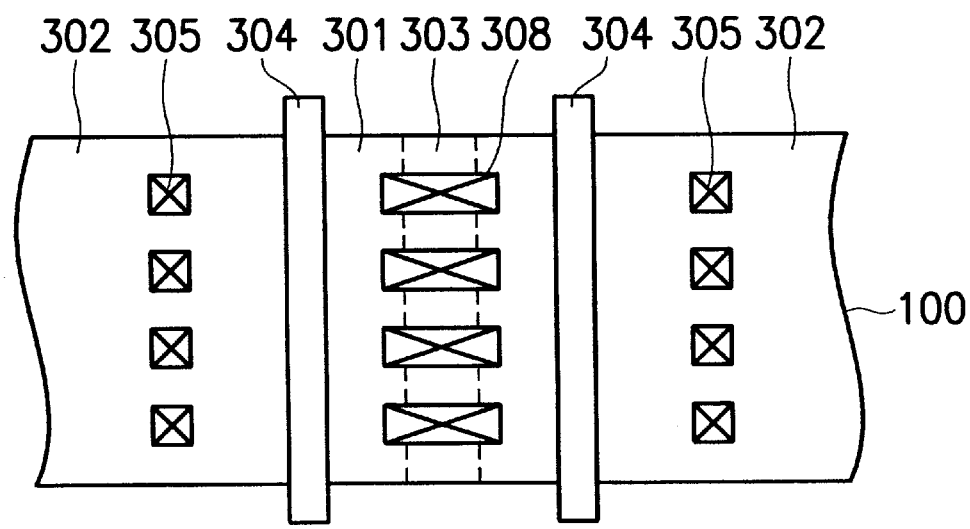
FIG. 7 depicts a layout diagram of an NMOS transistor of a buffer in accordance with a third preferred embodiment of the present invention from a top view.

Referring to FIG. 7, a layout diagram of an NMOS transistor of a buffer 100 in accordance with a third preferred embodiment of the present invention is illustrated from a top view. As in the second embodiment of the NMOS transistor of FIG. 4, only one P-type doped region 303 is formed along the central line in the source region 301. The P-type doped region 303 is bounded by the source region 301 and shaped into a rectangle. Note that the source region 301 is electrically connected to the P-type doped region 303 via butted contacts 308.

Referring to FIGS. 1 and 5, the base resistance RB of the base resistor 44 or 45 is less than the resistance R2 of the base resistor 17 of the NPN transistor 15 associated with the MOS-like device 18.

Referring to FIGS. 1 and 5, the multi-finger layer is utilized to implement the NMOS transistor 13 in the conventional buffer 10. During an ESD event, the triggering of the MOS-like device 18 is easier than that of the NMOS transistor 13 because RB<R2. Moreover, even though the NMOS transistor 13 and the MOS-like device 18 may be simultaneously turned on during the ESD event, the bipolar junction transistors 42 and 43 provide substantially the same base resistances to increase the holding current when entering snapback, and thus bypass the ESD discharge current uniformly. In addition, the spacing between the contact and gate can be further decreased to reduce the required layout area.

In conclusion, the buffer 100 of the present invention is provided with at least one MOS transistor configured with multi-finger layout to form a plurality of finger-type devices connected in parallel. Each of the finger-type devices provides a bipolar junction transistor with the base resistance less than that of the bipolar junction transistor provided by the MOS-like device in the LVTSCR so as to impede the conduction of the MOS transistor in the buffer 100 during an ESD event. Moreover, even though the MOS transistor of the buffer and the MOS-like device of the LVTSCR may simultaneously enter breakdown, the bipolar junction transistors ar parasitic onto the finger-type devices, and this cause the base resistances to increase the holding current when entering snapback and uniformly bypass the ESD discharge current. In addition, the spacing between the contact and gate can be further decreased to reduce the required layout area.

These embodiments described above are exemplified in view of the NMOS transistor 13 of the conventional buffer 10. However, those embodiments can be also applied to the PMOS transistor 12.

What is claimed is:

1. A buffer integrated with an ESD protection circuit onto a semiconductor substrate, said ESD protection circuit being triggered by means of a MOS-like device having a first spreading resistance during an ESD event, said buffer comprising:

at least one source region and a plurality of drain regions alternately formed in said semiconductor substrate;

a plurality of gate structures formed on said semiconductor substrate between each said drain region and said at least source region, respectively; and a doped region formed in said at least one source region;

wherein said at least source region, gate structures, and drain regions constitute finger-type devices, each said finger-type device having a second spreading resistance less than said first spreading resistance.

2. The buffer as claimed in claim 1, wherein said finger-type devices constitute a MOS transistor.

3. The buffer as claimed in claim 2, wherein each said finger-type device has a bipolar junction transistor formed in said semiconductor substrate, said bipolar junction transistor being configured with a base having said second spreading resistance.

4. The buffer as claimed in claim 1, wherein said doped region is formed in a central portion of said at one least source region, said doped region having an outer perimeter that is bounded by said at least one source region.

* * * * *

UNITED STATES PATENT AND TRADEMARK OFFICE
CERTIFICATE OF CORRECTION

PATENT NO. : 6,288,884 B1
DATED : September 11, 2001
INVENTOR(S) : Ta-Lee Yu

It is certified that error appears in the above-identified patent and that said Letters Patent is hereby corrected as shown below:

<u>Title page, Item [54] and Column 1, line 1,</u>
Should read -- MOS BUFFER IMMUNE TO ESD DAMAGE --

Signed and Sealed this

Nineteenth Day of November, 2002

Attest:

Attesting Officer

JAMES E. ROGAN
*Director of the United States Patent and Trademark Office*